United States Patent [19]

Wartofsky

[11] 4,140,976

[45] Feb. 20, 1979

[54] THERMALLY STABLE PUSH-PULL AMPLIFIER

[76] Inventor: David Wartofsky, 277 Homer St., Newton, Mass. 02159

[21] Appl. No.: 835,638

[22] Filed: Sep. 22, 1977

[51] Int. Cl.² .......................... H03F 3/183; H03F 3/30
[52] U.S. Cl. .................................... 330/265; 330/266; 330/311
[58] Field of Search ............... 330/262, 263, 265, 266, 330/267, 268, 270, 271, 311

[56]  References Cited

U.S. PATENT DOCUMENTS

| 3,042,875 | 7/1962 | Higginbotham | 330/271 |
| 3,537,023 | 10/1970 | Myer | 330/265 |
| 3,538,447 | 11/1970 | Johnson | 330/262 |
| 3,600,695 | 8/1971 | Krausser | 330/263 X |
| 3,631,357 | 12/1971 | Hadley | 330/267 X |

Primary Examiner—James B. Mullins
Attorney, Agent, or Firm—Russell & Nields

[57] ABSTRACT

A class B push-pull transistor power amplifier is disclosed having two amplification branches each of which is internally compensated in the signal processing/voltage amplifying section thereof for the effects of temperature on the transistors contained therein by allowing the outputs of the respective branches to drift apart slightly with temperature and using a portion of the quiesent current thus produced to alter the bias on the inputs of the respective branches.

2 Claims, 2 Drawing Figures

THERMALLY STABLE PUSH-PULL AMPLIFIER

BACKGROUND

(1) Field of Invention

This invention relates generally to amplifiers and more particularly to class B push-pull transistor power amplifiers suitable for use with high power loads.

(2) Summary of the Prior Art

Class B transistor power amplifiers are known to be efficient, relatively distortion free devices capable of providing power outputs substantially greater than single transistor circuits. For this reason a great deal of work has been done in the past toward the elimination of the phenomenon of crossover distortion and the compensation of alterations in the bias current arising from the unavoidable dissymmetry of transistors and the inherent sensitivity of transistors to changes in ambient temperature. In recent years, however, the demands for higher and higher output power capability have placed severe strains upon the abilities of this type of circuit.

Consider for example the class B transistor power amplifier shown by Myer in U.S. Pat. No. 3,537,023. In that circuit Myer has demonstrated that in a class B transistor power amplifier having a driver stage and a power stage it is possible by maintaining a substantially constant bias voltage between the base electrodes of the power stage transistors via the driver stage and by providing both alternating and direct current feedback to virtually eliminate crossover distortion and to center bias of the driver stage. As power outputs increase, however, the output transistors of Myer will tend to heat and as they heat the base-emitter junction resistance will decrease thereby increasing the emitter to collector leakage current. This situation leads to thermal runaway and the eventual destruction of the output transistors.

To compensate for this regenerative heating it is common in the art to use large heat sinks around the output transistors and in some cases to use fans to dissipate the destructive heat built up. Heat sinks and fans are costly additions to circuits of the above type in terms of weight, space, and circuit complexity, not to mention the added financial burden the addition of such devices entails. Consequently, some workers in the art have attempted to compensate for this regenerative heating by the use of thermally responsive circuit elements in the input section of the power stage in order to reduce the current bias on the transistors of that stage.

Thus, in one type of circuit a thermistor is connected between the bases of the output transistors which are also resistively connected to the collectors of the drive transistors of their respective branches. In this way a current splitting configuration is created wherein by choosing a thermistor whose resistance varies with temperature proportionally with the decrease base-emitter junction resistance in the output transistors, with increasing temperature, it is possible to vary the current bias on the output transistors in such a way that the regenerative effects of increased temperature are removed. Such circuits however suffer from the unreliability of thermistors which in some cases do not vary in resistance below a certain specified temperature and which may in many cases be expected to deviate from the desired rate of resistance change with temperature. Accordingly, while circuits of this type allow savings over those using fans and large heat sinks, they are undependable in the sense that an over compensated current bias will adversely effect output and an under compensated bias will eventually lead to runaway. Further, the resistive connection of the driver stage to the power stage will cause irritating signal losses and the thermistor itself may introduce noise.

A second type of compensating means for such circuits consists of an amplifier connected in common emitter configuration with the output point of the amplifier. In this circuit the respective bases of the power stage transistors are resistively connected to the collectors of the driver stage transistors and the bases of the compensating means are current biased respectively by the emitters of the respective power stage output transistors. In this way a current splitting configuration is again created in the input to the power stage which will alter the current bias on the bases of the output power stage transistors as the base-emitter junction resistance of these transistors decreases with increasing temperature. Again, however, signal loses are inherent in the current splitting configuration and noise is introduced into the circuit. Further, the very temperature sensitivity of transistors, which the compensation means is attempting to correct for in the power stage, will effect the compensation amplifier. In such a case the over compensated current bias to the bases of the output power stage transistors will adversely effect the output in the same manner as the above described over compensated thermistor method.

SUMMARY OF THE PRESENT INVENTION

The present invention solves the above problem of thermal compensation without the introduction of noise, signal losses, or other forms of distortion by providing a class B push-pull transistor power amplifier comprising two amplification branches each of which is internally compensated in the signal processing/voltage amplifying section thereof for the effects of temperature on the transistors contained therein. More particularly, each branch comprises a signal transistor of one type preferably although not necessarily in a common emitter configuration and generally includes one or more power transistors of the complementary type in a cascaded common collector configuration, the transistors of each branch being arranged in reverse order with respect to type; and a thermal compensation means. The signal transistors have their bases capacitively coupled to the input and their emitters respectively connected to the opposite poles of a direct current source and the power transistors are connected in emitter follower configuration such that their collectors are respectively connected to the appropriate pole of said source, the base of the first such power transistor in each branch is connected to the collector of the signal transistor of that branch, and the emitter of the last power transistor in each branch is resistively connected to the output. The thermal compensation means comprises a resistive connection of the emitter of the last power transistor in each branch to the base of the signal transistor of that branch which allows the use of a portion of the output current of the last power transistor to alter the bias on the base of the signal transistor in such a way that the current bias on the base of the power transistor is adjusted sufficiently to compensate for the temperature induced current leakage of these transistors, without adverse effect upon output signal integrity.

It is thus an object of the present invention to provide a class B push-pull transistor amplifier suitable for use with essentially all levels of load power.

It is also an object of the present invention to provide a class B push-pull transistor power amplifier which is stable and essentially distortion free under substantially all conditions of practical use, yet which is inexpensive to fabricate.

Further, it is an object of the present invention to provide a class B push-pull transistor power amplifier capable of handling sharp signal transients without significant distortion regardless of load.

Still further, it is an object of the present invention to provide a circuit of the above type which once set for a specified voltage level need not be adjusted upon replacement of the output components.

BRIEF DESCRIPTION OF THE DRAWINGS

These, as well as other features, objects, and advantages of the present invention, will be more clearly understood by reference to the following detailed description of an exemplary embodiment of the present invention and to the drawings in which.

DETAILED DESCRIPTION

Figure 1:
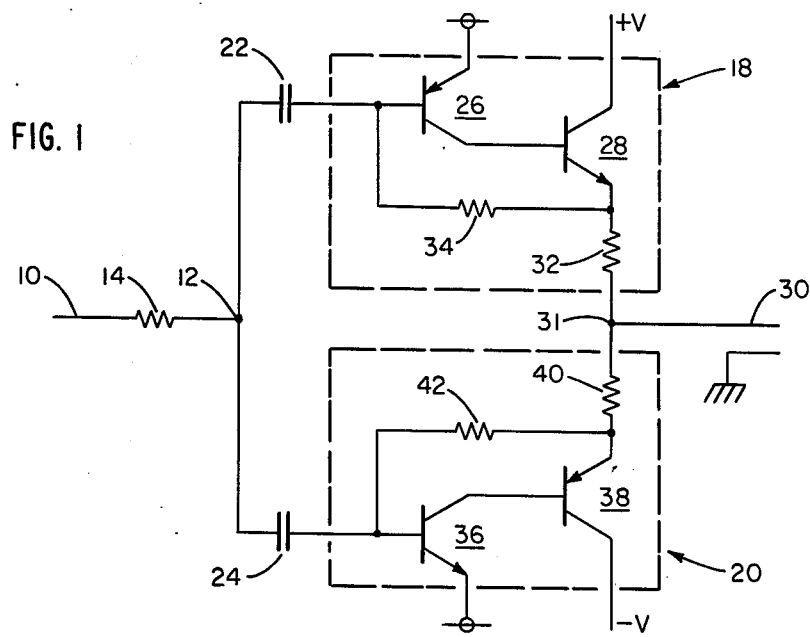
FIG. 1 is a schematic diagram of an illustrative embodiment of a circuit constructed in accordance with the principals of the invention.

Referring now specifically to FIG. 1, there is schematically depicted therein an illustrative example of a class B push-pull transistor power amplifier constructed in accordance with the principles of the present invention. The input to the amplifier is applied at input terminal 10 and thence to point 12 thru resistor 14. It is noted that resistor 14 may be eliminated if appropriate biasing resistors are provided at the emitters of transistors 26 and 36. The signal appearing at point 12 is applied to two amplification branches, indicated at 18 and 20, by capacitors 22 and 24 respectively. Branch 18 comprises a signal transistor 26 of the PNP type having its emitter connected to the $+V$ terminal of a direct current source (hereinafter dc source) and its base connected to capacitor 22; and a power transistor 28 of the NPN type having its collector connected to the $+V$ terminal of the d.c. source, its base connected to the collector of the signal transistor 26, and its emitter connected to the output terminal 30 by resistor 32 and to the base of signal transistor 26 by resistor 34. Branch 20 on the other hand comprises a signal transistor 36 of the NPN type having its emitter connected to the $-V$ terminal of a d.c. source and its base connected to capacitor 24; and a power transistor 38 of the PNP type having its collector connected to the $-V$ terminal of the d.c. source, its base connected to the collector of transistor 36, and its emitter connected to the output terminal 30 by resistor 40 and to the base of transistor 36 by resistor 42. It should be understood, however, that the power transistors can be eliminated and the signal transistors can be connected in common collector as opposed to the above described common emitter configuration as the particular parameters of the application may require without giving up the benefit of thermal compensation which this invention provides.

In considering the operation of the circuit shown in FIG. 1, it is noted that the provision of resistors 32 and 40 allows the outputs of transistors 28 and 38 to drift apart as their respective leakage currents are altered from their original matched relation by the effects of ambient temperature changes, increased internal power dissipation, and the thermal drift of the other transistors. By feeding back a small portion of the quiesent current thus produced at the emitters of transistors 28 and 38 respectively to the bases of transistors 26 and 36 respectively via resistors 34 and 42 it is thus possible to alter the bias on transistors 26 and 36 in direct proportion to the temperature effects on transistors 28 and 38. It will accordingly further be seen that by so altering the bias on transistors 26 and 36 the effective current bias produced at the bases of transistors 28 and 38 respectively is reduced, also in proportion to the temperature effects on those transistors, thereby stabilizing the amplifier branches 18 and 20 without adverse effect on their signal transfer characteristics. Also, as the resistance values of resistors 32 and 40 will generally be chosen to be quite small in comparison to resistors 34 and 42, the above described feedback will coincidentally with its thermal compensating function tend to center the bias of the amplifier thereby eliminating the need to provide separate feedback from point 31 to the bases of transistors 26 and 36 to zero the output under zero input signal conditions.

Figure 2:
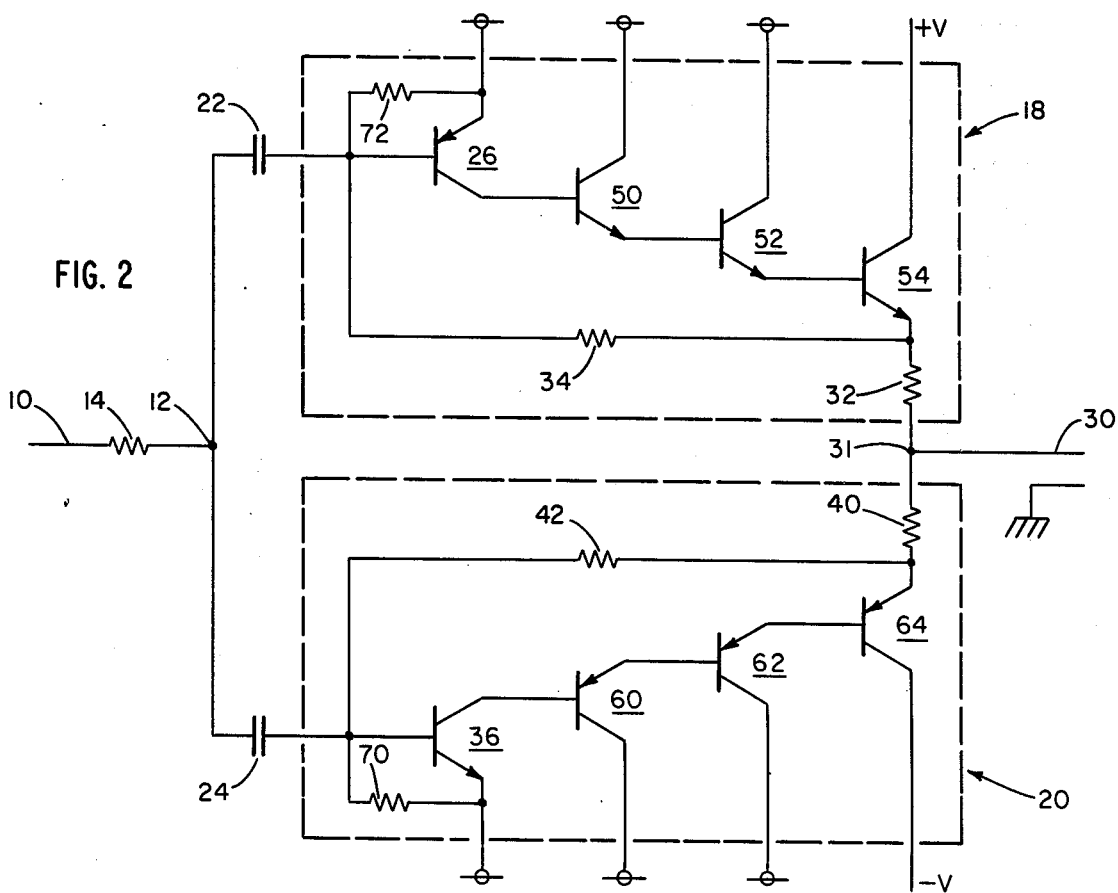
FIG. 2 is a diagram of a circuit which is a modification of that shown in FIG. 1.

FIG. 2 shows a circuit essentially similar to FIG. 1 wherein similar reference numerals have been used to designate corresponding parts of the respective circuits. The differences between FIG. 1 and FIG. 2 are as follows. In FIG. 2 transistors 28 and 38 are respectively replaced by transistors 50, 52 and 54 and transistors 60, 62 and 64 which are connected in emitter follower configuration in each respective branch, and resistors 70 and 72 connect points 90 and 92 respectively to the emitters of transistors 36 and 26. Resistors 70 and 72 allow a fine adjustment in the thermal compensation of each branch respectively and also allow the use of more commonly available less costly intermediate resistance values for resistors 34 and 42 than the high values which are generally otherwise required. The inclusion of the emitter follower arrangements of transistors 50, 52 and 54 and 60, 62 and 64 is simply indicative of the possibility of the obtaining greater power output capability for the amplifier by such cascading with exactly the same type of thermal compensation as has already been described with respect to FIG. 1.

Accordingly, it is seen that with the class B push-pull transistor power amplifier constructed in accordance with the principles of the present invention, there is achieved an inexpensive yet extremely stable means of power amplification for audio and other applications wherein it is necessary to drive high power loads. The circuit has fewer and more stable components than prior thermally compensated circuits and thus inherently displays less internal distorting noise. There are also substantially no signal losses in the circuit because the only in line resistors, 32 and 40, are very small and, consequently the frequency response of the circuit is extremely good, typically ±0.05 decibels between 20 hertz and 20,000 hertz, and typically less than 0.1% total haromonic distortion. Further, it will be understood that once the components of the circuit have been appropriately selected and assembled for a particular voltage level application it is not necessary to adjust the circuit should it later become necessary to replace some or all of the output components.

Finally, and most importantly, a circuit constructed in accordance with the present invention compensates each branch separately for the particular thermally induced distortion present therein, and the compensation has no effect upon either the signal or the other branch of the circuit. From the illustrative examples described and portrayed herein by way of disclosure, rather than limitation, it should be understood that various modifications, substitutions, and combinations may be effected without departure from the spirit and scope of this invention in its broader aspects.

I therefore claim:

1. A thermally stable class B push-pull transistor amplifier circuit particularly adapted for use with A.C. input and high power loads comprising an input terminal; an output terminal; a first amplification branch and a second amplification branch separately coupled with the input terminal for push-pull operation, such that said first and second branches are blind to the D.C. characteristics of the input signal each branch having an output point and including at least one appropriately biased transistor connected in series, the output of the last transistor of each series being connected directly to the output point of its respective branch, and each output point being separately resistively coupled with the output terminal, and the input of the first transistor of its respective branch thereby providing a feedback of a portion of the quiesent current present at the output point of each branch to the input of the first transistor of that branch to internally compensate each branch individually for the effects of temperature.

2. The class B push-pull transistor amplifier of claim 1 wherein each branch includes a signal transistor and at least one power transistor; the signal transistors and power transistors of the respective branches are of complementary types; the signal transistor of the first branch is of a complementary type to the signal transistor of the second branch; and the signal transistors are connected in common emitter configuration and the power transistors are connected in emitter follower configuration.

* * * * *